(12) United States Patent
Chen et al.

(10) Patent No.: US 9,013,202 B2
(45) Date of Patent: Apr. 21, 2015

(54) TESTING STRUCTURE AND METHOD OF USING THE TESTING STRUCTURE

(75) Inventors: Fen Chen, Williston, VT (US); Kai Di Feng, Hopewell Junction, NY (US); Pui Ling Yee, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 331 days.

(21) Appl. No.: 13/478,137

(22) Filed: May 23, 2012

(65) Prior Publication Data
US 2013/0314119 A1    Nov. 28, 2013

(51) Int. Cl.
G01R 31/02    (2006.01)
H01L 21/66    (2006.01)

(52) U.S. Cl.
CPC ............. *H01L 22/34* (2013.01); *H01L 2924/00* (2013.01); *H01L 2924/0002* (2013.01)

(58) Field of Classification Search
CPC .................................................. G01R 31/2323
USPC ................................................... 324/762.01
See application file for complete search history.

(56) References Cited

U.S. PATENT DOCUMENTS

| | | | |
|---|---|---|---|
| 4,050,017 A * | 9/1977 | Paufve | 324/72.5 |
| 4,577,149 A | 3/1986 | Zbinden | |
| 6,049,213 A | 4/2000 | Abadeer | |
| 6,184,720 B1 * | 2/2001 | Kim et al. | 327/37 |
| 6,249,158 B1 * | 6/2001 | Schillhof et al. | 327/124 |
| 6,429,677 B1 | 8/2002 | Montrose | |
| 6,435,408 B1 * | 8/2002 | Irwin et al. | 235/441 |
| 6,774,643 B2 * | 8/2004 | Magill | 324/663 |
| 6,781,401 B2 | 8/2004 | Kim | |
| 6,995,027 B2 | 2/2006 | Wieczorek et al. | |
| 7,170,309 B2 | 1/2007 | Kim | |
| 7,271,608 B1 | 9/2007 | Vermeire et al. | |
| 7,362,143 B2 * | 4/2008 | O'Keeffe | 327/77 |
| 7,579,859 B2 | 8/2009 | Liao et al. | |
| 7,825,679 B2 | 11/2010 | Martin et al. | |
| 7,948,259 B2 | 5/2011 | Martin et al. | |
| 8,200,178 B2 * | 6/2012 | Moser et al. | 455/226.1 |
| 8,368,418 B2 * | 2/2013 | Hasegawa | 324/762.01 |
| 2002/0033710 A1 | 3/2002 | Kim | |
| 2004/0239359 A1 * | 12/2004 | Matsumoto | 324/763 |
| 2006/0238214 A1 * | 10/2006 | Itoh | 324/765 |
| 2007/0059850 A1 * | 3/2007 | Zhao et al. | 438/14 |
| 2007/0103184 A1 * | 5/2007 | Kim | 324/769 |
| 2007/0132486 A1 * | 6/2007 | O'Keefe | 327/77 |
| 2007/0210950 A1 * | 9/2007 | Johnson et al. | 341/154 |
| 2008/0297181 A1 * | 12/2008 | Ausserlechner | 324/725 |
| 2009/0316454 A1 * | 12/2009 | Colbeck et al. | 363/89 |
| 2010/0225347 A1 * | 9/2010 | Worley et al. | 324/765 |
| 2010/0291892 A1 * | 11/2010 | Moser et al. | 455/226.2 |
| 2011/0031981 A1 * | 2/2011 | Tsujikawa | 324/554 |
| 2011/0227637 A1 * | 9/2011 | Stuber et al. | 327/546 |
| 2011/0279142 A1 * | 11/2011 | Cho et al. | 324/762.01 |
| 2012/0242380 A1 * | 9/2012 | Edwards | 327/143 |
| 2013/0093431 A1 * | 4/2013 | Raman et al. | 324/537 |
| 2013/0200447 A1 * | 8/2013 | Yen et al. | 257/296 |

* cited by examiner

*Primary Examiner* — Benjamin M Baldridge
(74) *Attorney, Agent, or Firm* — Catherine Ivers; Roberts Mlotkowski Safran & Cole, P.C.

(57) ABSTRACT

A metal-to-metal leakage and breakdown testing structure for semiconductor structures and method of using the testing structure is disclosed. The testing structure includes plurality of resistor bridges connected to respective two terminal devices. The testing structure further includes a plurality of switches each having a voltage node provided between resistors of a respective one of the plurality of resistor bridges. The voltage node is read at a circuit pad when a respective one of the plurality of switches is in an on state. The testing structure further includes a device turning on and off each of the plurality of switches, individually.

17 Claims, 6 Drawing Sheets

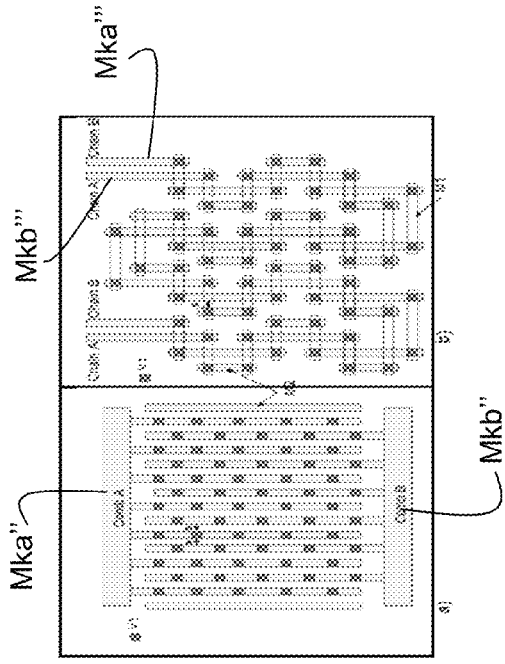
FIG. 2a
FIG. 2b
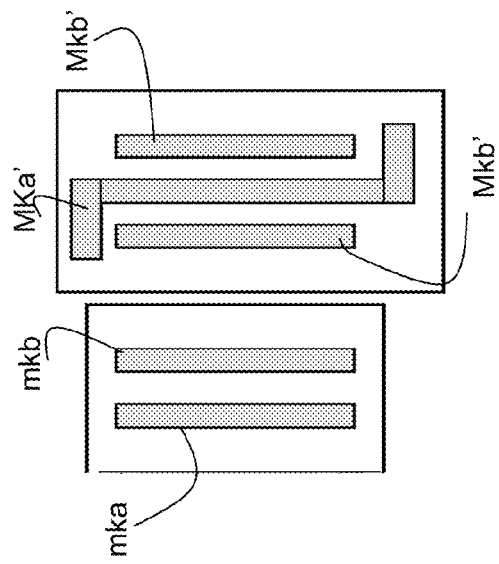
FIG. 2c
FIG. 2d
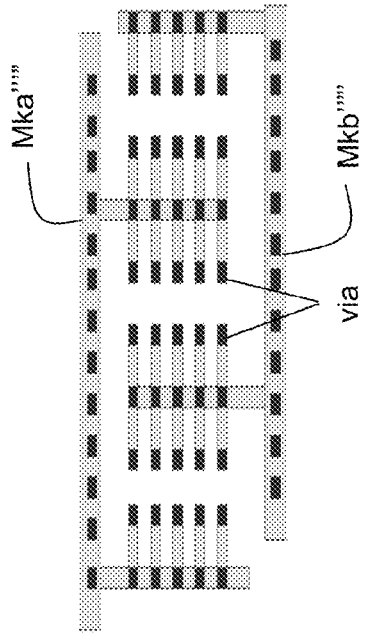
FIG. 2e
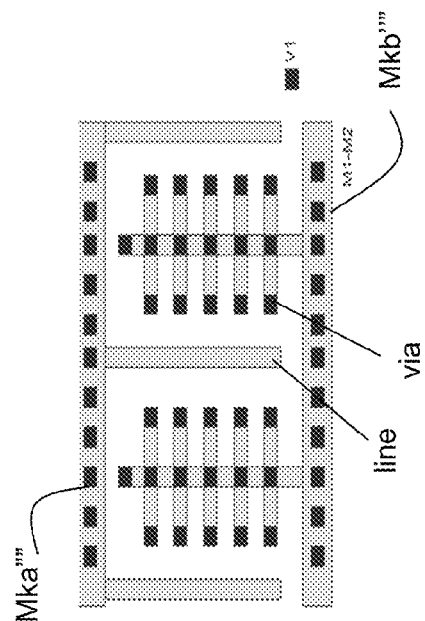
FIG. 2f

TESTING STRUCTURE AND METHOD OF USING THE TESTING STRUCTURE

FIELD OF THE INVENTION

The invention relates to a testing structure for semiconductor structures and, more particularly, a metal-to-metal leakage and breakdown testing structure for semiconductor structures and method of using the testing structure.

BACKGROUND

Low-k dielectric materials are known to improve chip resistance-capacitance (RC) delay, minimize cross talk noise, and reduce power dissipation. These low-k dielectric materials are thus indispensable for the continuous scaling of advanced VLSI circuits, particularly that of high performance logic circuits. However, with the wide application of low-k and ultralow-k dielectric materials at the 90 nm technology node and beyond, the long-term reliability of such materials is rapidly becoming one of the most critical challenges for technology qualification. For example, low-k time dependent dielectric breakdown (TDDB) is commonly considered an important reliability issue because low-k materials generally have lower intrinsic breakdown strengths than traditional $SiO_2$ dielectrics. This problem is further exacerbated by the aggressive shrinking of interconnect spacing resulting from continuous technology scaling.

In order for the process community to improve low-k dielectric TDDB performance, it is necessary to identify early fails and failure modes. To obtain meaningful TDDB data which can be used to identify yield/defect problems and the weak point of the process, test structures have to have large critical area. However, it is very difficult to pin point the exact location and the cause of failure with current methods of TDDB stress and failure analysis.

Accordingly, there exists a need in the art to overcome the deficiencies and limitations described hereinabove.

SUMMARY

In a first aspect of the invention, a testing structure circuit comprises plurality of resistor bridges connected to respective two terminal devices. The testing structure further comprises a plurality of switches each having a voltage node provided between resistors of a respective one of the plurality of resistor bridges. The voltage node is read at a circuit pad when a respective one of the plurality of switches is in an on state. The testing structure further comprises a device turning on and off each of the plurality of switches, individually.

In another aspect of the invention, a circuit comprises a plurality of metal pairs of different patterns with a predefined separation distance. Dielectric material (e.g., low k or ultra low k) under test is filled between the each metal pair. One metal is connected to a pad of the power supply and the other end is connected to resistor bridges comprising two resistors in series. The circuit further comprises a plurality of PFET switches each coupled to a voltage node between the two resistors. The circuit further comprises a common circuit pad connected to each voltage node, for reading a voltage at the voltage node when each of the plurality of PFET switches is in an on state. The circuit further comprises a decoder which is configured to turn on and off each of the plurality of PFET switches, individually. The circuit further comprises a microcontroller configured to provide instructions to the decoder, based on a digital signal received from an analog to digital converter.

In another aspect of the invention, a method comprises turning on a switch located between a pair of resistors in series. The method further comprises determining a voltage drop by reading a voltage at a voltage node between the pair of resistors, when the switch is on. The method further comprises determining a leakage current of a two terminal device based on a comparison of the voltage drop and a stress voltage.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 2a-2f show various exemplary unit cell configurations for using the testing structure of the present invention;

DETAILED DESCRIPTION

The invention relates to a testing structure for semiconductor structures and, more particularly, a metal-to-metal leakage and breakdown testing structure for semiconductor structures and a method of using the testing structure. More specifically, and advantageously, the testing structure of the present invention is a time-dependent dielectric breakdown (TDDB) testing structure that provides a specific address of a failed circuit element for large critical area stressing. By providing a specific address of a failed circuit, the testing structure of the present invention can be used for precisely controlling process parameters during manufacturing of an integrated circuit.

Advantageously, in implementing the testing structure of the present invention, it is now possible to perform large sample size TDDB test on chip, with instant diagnosis of the breakdown unit cell (without the need for physical failure analysis (PFA) localization). In fact, compared with PFA, the present invention provides a greater than 400× accuracy improvement. The testing structure of the present invention can also monitor and identify the elevated leakage element (e.g., failed circuit element due to dielectric breakdown) individually for process debugging. As a further advantage, the testing structure of the present invention can be implemented as an on-chip back-end-of-the line (BEOL) TDDB sensor to monitor BEOL TDDB degradation during chip operation, in real time. Moreover, the present invention provides a novel resistance bridge circuit to assure that there is no post breakdown interference between unit cells.

In operation, during test, the testing structure instructs the circuit to sequentially route a measured signal from each addressed location to a single output pin. By applying a series of addresses, the circuit, e.g., entire set of structures, can be scanned for fail signatures. The addressing information can then be used to identify the exact location of each failing site, i.e., determine a location of a failed circuit element. The failed circuit can be determined by a comparison of a known stressed voltage to a node voltage, read out between the novel resistance bridge (with known resistance).

Figure 1:
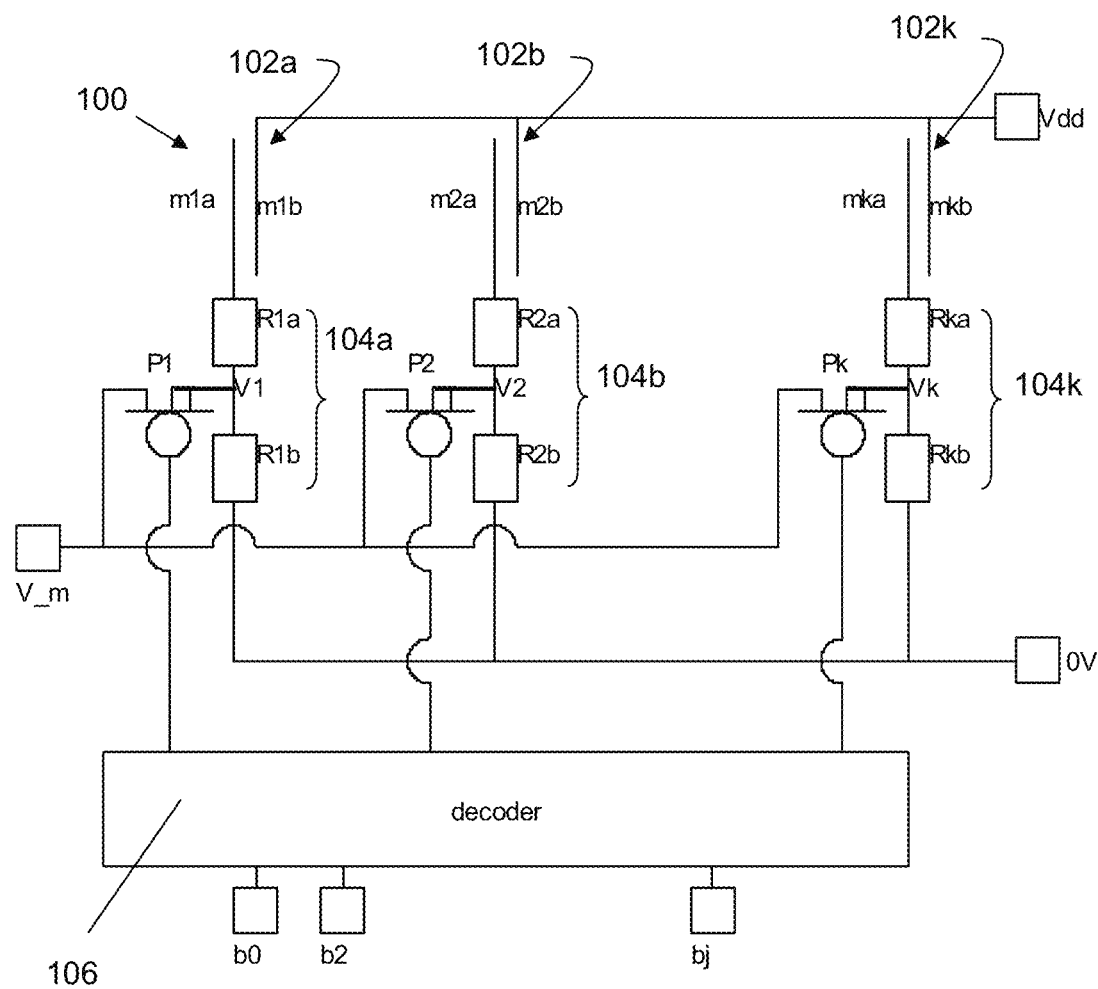
FIG. 1 shows a testing structure in accordance with aspects of the present invention.

FIG. 1 shows a testing structure in accordance with aspects of the present invention. More specifically, the testing structure 100 of the present invention includes a plurality of two terminal devices 102a, 102b . . . 102k. Although three two terminal devices are shown, it should be understood by those of skill in the art that two or more two terminal devices are contemplated by the present invention. Also, as should be understood by those of skill in the art, the two terminal devices 102a, 102b . . . 102k are elements of the circuit, comprising capacitors (e.g., a first trace line and a second trace line in a circuit). For example, (i) two terminal device 102a comprises two metal elements (also referred to as metal pairs) m1a and m1b, (ii) two terminal device 102b comprises two metal elements m2a and m2b, and (iii) two terminal device 102k comprises metal elements mka and mkb. As described below, the metal pairs can have different patterns, with different separations therebetween (predefined separations). As should be understood by those of skill in the art, a dielectric material, e.g., low-k dielectric material, is provided between the elements. In embodiments, the elements m1b, m2b . . . mkb are metal lines connected to a stress voltage, Vdd. By using a common Vdd, it is possible to voltage stress the two terminal devices 102a, 102b . . . 102k (i.e., metal lines) at an elevated voltage.

In embodiments, the elements m1a, m2a . . . mka are metal lines, which are connected to a respective plurality of voltage dividers 104a, 104b . . . 104k. The voltage dividers 104a, 104b . . . 104k each comprise two resistors, in series (i.e., resistor bridges). For example, (i) the voltage divider 104a comprises resistors R1a and R1b, (ii) the voltage divider 104b comprises resistors R2a and R2b, and (iii) voltage divider 104k comprises resistors Rka and Rkb. It should be understood that the plurality of voltage dividers 104a, 104b . . . 104k will correspond with each two terminal devices 102a, 102b . . . 102k. A voltage node V1, V2 . . . Vk is read-out (provided) between the resistors, as described in more detail below.

The testing structure 100 additionally includes switches P1, P2 . . . Pk, each corresponding with the voltage dividers 104a, 104b . . . 104k. In embodiments, the switches P1, P2 . . . Pk are PFETs, each having a node V1, V2 . . . Vk positioned between the respective resistors of each voltage divider 104a, 104b . . . 104k. In embodiments, the node voltages V1, V2, . . . Vk are read-out voltages of the respective switches P1, P2 . . . Pk, when provided in an "on" state. In embodiments, the voltages can be read at common circuit pad, V_m.

In embodiments, the resistance ratio of the resistors of the voltage dividers 102a, 102b . . . 102k is selected to assure that the maximum possible voltage at V1, V2 . . . Vk is lower than the maximum allowed operating voltage of the switches P1, P2 . . . Pk. This will ensure that the applied stress voltage, Vdd, will not damage or blow the switches P1, P2 . . . Pk when any two terminal device of 102a, 102b . . . 102k is short circuit due to breakdown. For example, if Vdd is 10V and the maximum allowed operating voltage of the switches P1, P2 . . . Pk is 1V, the resistance ratio of Rja/Rjb (j=1, 2, . . . k) should be greater than 9:1. Thus, in embodiments, the resistor type of Rja (j=1, 2, . . . k) should also be selected to handle the high voltage of Vdd. Additionally, the values of the resistors should be large enough to handle a worse case failure mode of the metal line pairs, e.g., mka, mkb, being completely shorted. Thus, in the configuration of the present invention, the current through the resistors will be less than the maximum allowable current based on the design rule guidelines.

Still referring to FIG. 1, in embodiments, the switches P1, P2, . . . Pk can be turned on one at a time under the control of a decoder 106, in order to connect V1, V2, . . . Vk to a voltage test line connected to the chip pad of V_m. By comparing the applied test voltage Vdd to the node voltages V1, V2, . . . Vk, in the PFET on state, the testing structure 100 of the present invention can provide an indication of a stress induced leakage current from failure of the dielectrics between specific metal line pairs (e.g., elements Mka, Mkb). In embodiments, as the leakage current is always from Rja to Rjb (j=1, 2, . . . k), for example, the voltage of the connection point of Rja to Rjb (j=1, 2, . . . k) is always positive. Therefore the PFET source is always at positive voltage against the drain and the gate when the PFET is turned on.

This voltage drop on Rkb can be used to determine the leakage current of 102k after the voltage Vdd is applied on the device 102k using the following equation:

$$I=V_j/Rjb.$$

When the switch Pj (j=1, 2, . . . k) is turned on, the voltage Vj (j=1, 2, . . . k) can be read out at V_m if Vj is greater than the threshold voltage of Pj.

FIGS. 2a-2f show various unit cell configurations which can be implemented with the testing structure of the present invention. It should be understood by those of ordinary skill in the art that the various cell configurations shown in FIGS. 2a-2f are merely illustrative examples of elements, mja, mjb (j=1, 2, . . . k), and that different cell configurations can be implemented with the present invention.

In FIG. 2a, the two terminal device comprises two parallel metal traces or elements, mka, mkb. In the implementation of FIG. 2a, the testing structure of the present invention will determine leakage between the parallel metal traces or elements, mka, mkb. In FIG. 2b, the two terminal device comprises elements mka' and mkb' positioned on opposing sides of a serpentine trace 20. In the implementation of FIG. 2b, the testing structure of the present invention will determine leakage between the elements, mka' and mkb', and the serpentine trace 20.

In FIG. 2c, the two terminal device comprises two comb elements mka" and mkb", connected through a via. In the implementation of FIG. 2c, the testing structure of the present invention will determine leakage between the comb elements, mka" and mkb". In FIG. 2d, the two terminal device comprises an interdigital via chain represented by elements mka'" and mkb'". In the implementation of FIG. 2d, the testing structure of the present invention will determine leakage between the elements, mka'" and mkb'".

In FIG. 2e, the two terminal device comprises elements mka"" and mkb"", with a via to line configuration. That is, in the implementation of FIG. 2e, the testing structure of the present invention will determine leakage between the via and line. In FIG. 2f, the two terminal device comprises elements mka"" and mkb"" implemented in a via to via configuration. In the implementation of FIG. 2f, the testing structure of the present invention will determine leakage between the vias.

Figure 3:
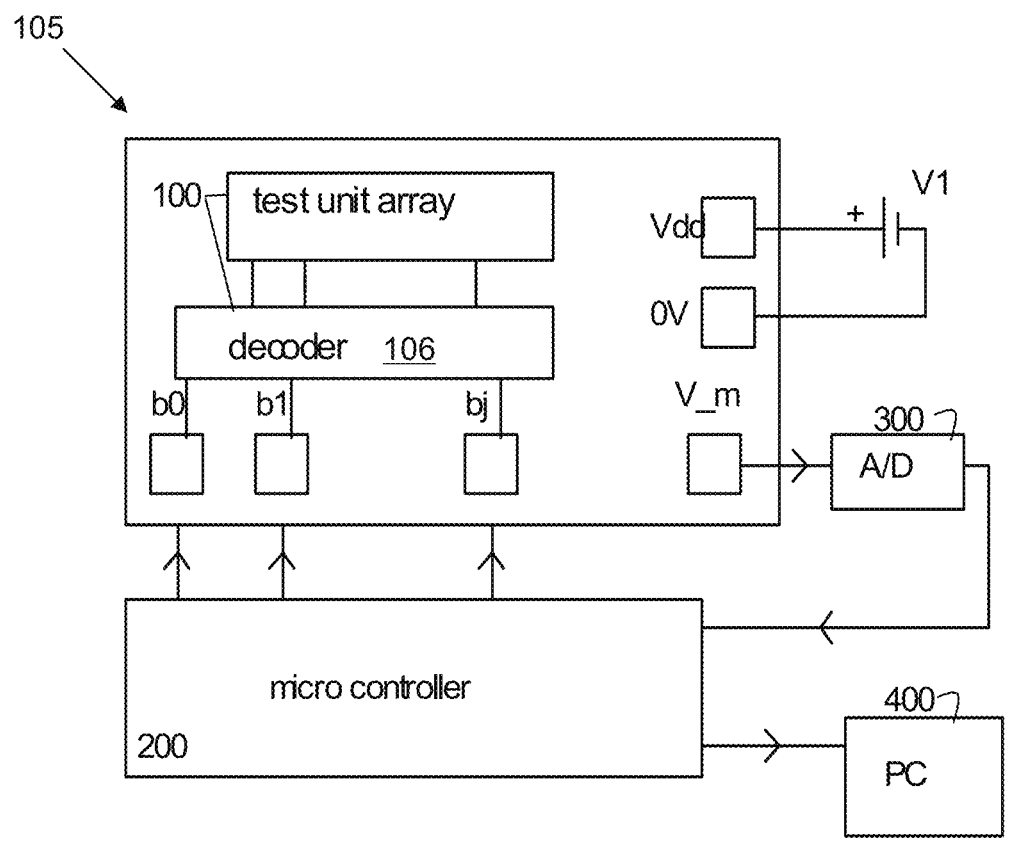
FIG. 3 shows a test unit implementing the testing structure in accordance with aspects of the present invention.

FIG. 3 shows a test unit implementing the testing structure in accordance with aspects of the present invention. More specifically, the test unit 105 includes the testing structure 100 of the present invention, which includes the decoder 106. The test unit 105 also includes a microcontroller 200, an analog to digital convertor 300 and a computing system 400, e.g., personal computer. In embodiments, the microcontroller 200 is connected to the decoder 106; whereas the analog to digital convertor 300 is connected to both the microcontroller 200 and V_m. The computer system 400, on the other hand, is connected only to the microcontroller 200. V1 is an off chip power supply which provides the stress voltage, Vdd.

In operation, the microcontroller 200 provides codes of b0, b1, . . . bj to the decoder 106. The codes, in turn, provide instructions for the decoder 106 to output a selection of a specific switch P1, P2 . . . Pk. That is, the codes are used by the decoder 106 to selectively and individually turn on each switch P1, P2 . . . Pk for measuring leakage of a respective two terminal device. In embodiments, the microcontroller 200 can sweep all the logic combinations of b0, b1 . . . bj so that all of the metal line pairs (e.g., two terminal devices 102a, 102b . . . 102k) can be measured one by one, i.e., voltage nodes V1, V2 . . . Vk can be measured, as each of the respective switches P1, P2 . . . Pk is turned on.

The analog to digital converter 300 converts the analog voltage received from V_m to digital format on the selected resistor Rjb, resulting from the leakage current of the corresponding two terminal devices 102a, 102b . . . 102k. The digital data is input to the microcontroller 200 which, in turn, is used by the microcontroller 200 to determine the sequence of codes, i.e., so as to not duplicate previous readings.

The microcontroller 200 is connected to the computing system 400, which performs post processing of the leakage data, e.g., determine leakage current data, etc. The computing system 400 can save and display the leakage data. For example, when the leakage of any of the metal line pairs, i.e., two terminal devices 102a, 102b . . . 102k increases, the voltage on the corresponding resistor Rjb increases as well. The voltage at each corresponding voltage node, i.e., V1, V2 . . . Vk, can be measured and recorded, so that the leakage current performance of each pair of metal lines over time can be shown. By knowing the values of the resistors, the known voltage supply, and the reading of the voltage at the nodes, it is possible to determine the leakage current, as described herein.

Figure 4A:
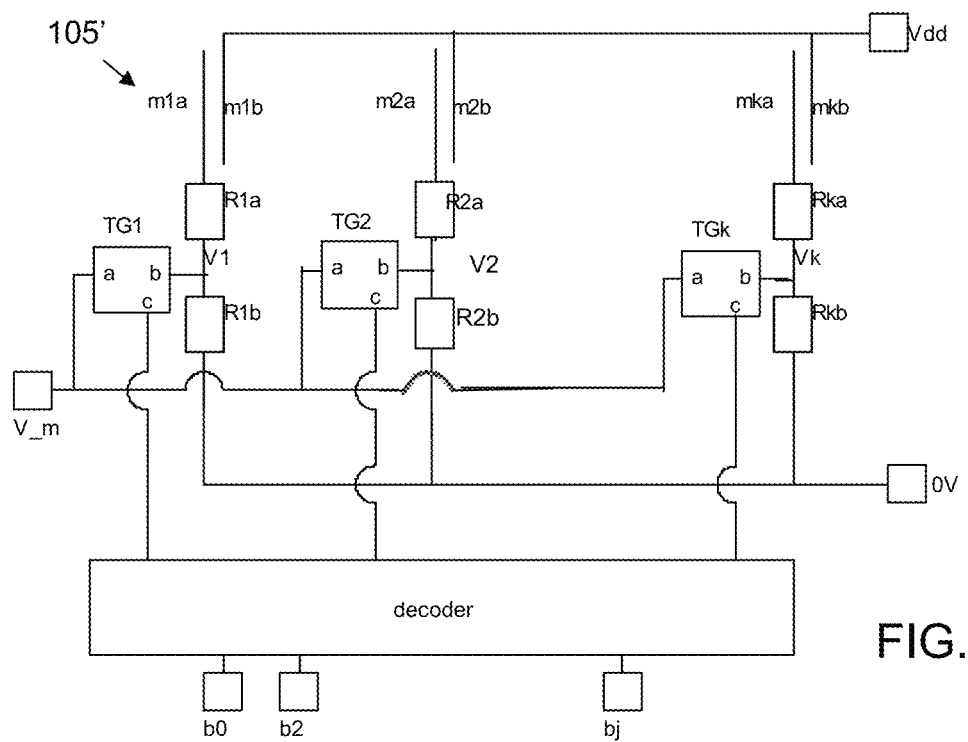
FIG. 4a shows an alternative testing structure in accordance with aspects of the present invention.

FIG. 4a shows an alternative testing structure in accordance with aspects of the present invention. In particular, the testing structure 105' of FIG. 4a includes transmission gates TG1, TG2 . . . TGk (instead of PFET switches P1, P2 . . . Pk). In embodiments, the transmission gate TGk includes control terminal c and terminals a, b. In operation, when the control terminal c of the transmission gates TG1, TG2 . . . TGk is at logic low, the terminals a and b are connected. On the other hand, when the control terminal c is at logic high, terminals a and b are disconnected.

Figure 4B:
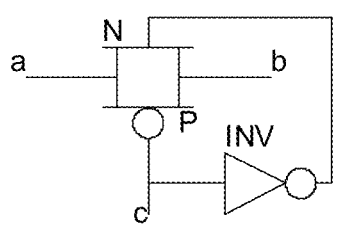
FIG. 4b shows a transmission gate of the testing structure of FIG. 4a, in accordance with aspects of the present invention.

FIG. 4b shows a transmission gate of the testing structure of FIG. 4a, in accordance with aspects of the present invention. In embodiments, the transmission gate Tgk includes control terminals a, b, and c. The transmission gate TGk also includes an NFET, N, and a PFET, P, where the sources and drains are connected in parallel. The transmission gate TGk also includes an inverter, INV. In embodiments, when the control terminal c is at logic low, both the NFET, N, and PFET, P, are turned on so the terminals a and b are connected. On the other hand, when the control terminal c is at logic high, both NFET, N, and PFET, P, are turned off, so terminals a and b are disconnected. This circuit improves leakage readout resolution by capturing low levels of leakage; whereas, the circuit shown in FIG. 1 is for leakage current larger than 20 uA, usually for shorts. In alternative embodiments, the inverter INV is located in the decoder block and both the both NFET, N, and PFET, P, are controlled with a two wire control bus.

Figure 5:
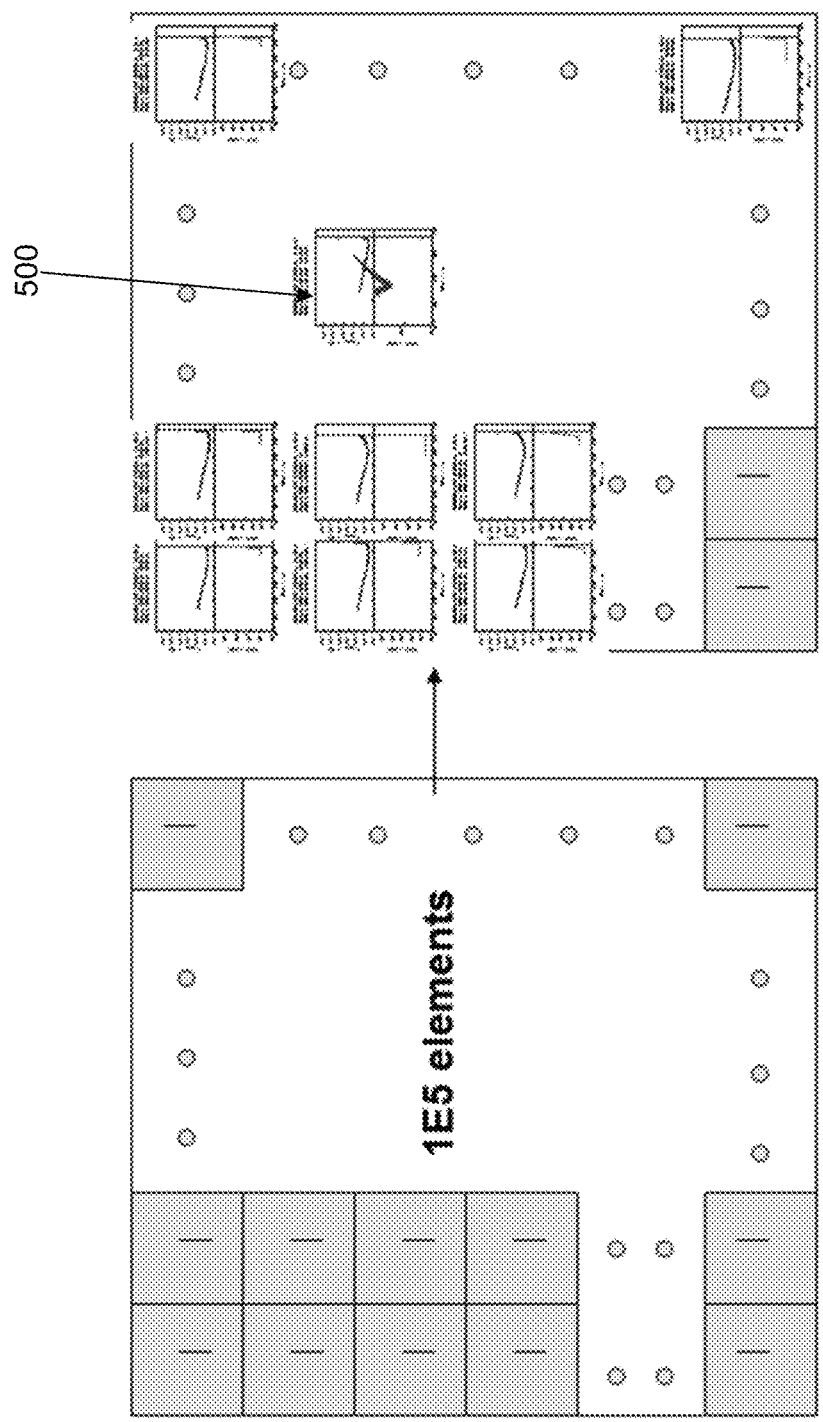
FIG. 5 shows a graphical representation of monitoring and detecting a precise location of a breakdown element, as implemented in accordance with aspects of the present invention.

FIG. 5 shows a graphical representation of monitoring and detecting a precise location of a breakdown element. As should now be understood, element leakage vs. time behavior can be individually monitored, and the defects identified by showing elevated leakage and abnormal leakage to time characteristics. More specifically, in this graphical representation, it has been determined that unit cell 500 is the first monitored breakdown element of the tested elements. This graphical representation can be provided on the display of the computing system 400.

Figure 6:
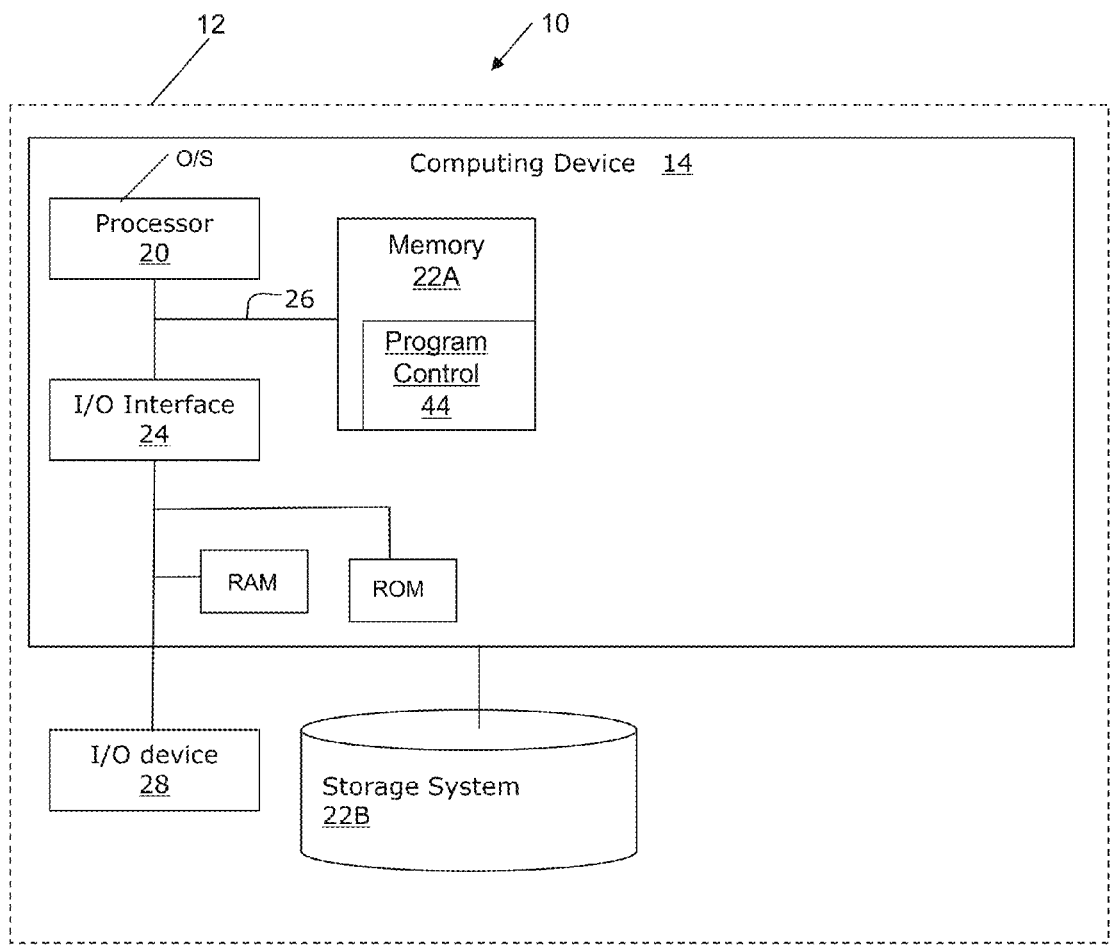
FIG. 6 shows a computing system implementing aspects of the present invention.

FIG. 6 shows a computing infrastructure implementing aspects of the present invention. The computing infrastructure can be representative of the computing device 400 and/or microcontroller 200. To this extent, the computing infrastructure 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1). The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S). The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc. In general, the processor 20 executes computer program code (e.g., program control 44), which can be stored in the memory 22A and/or storage system 22B. Moreover, in accordance with aspects of the invention, the program control 44 provides the processes described herein. The program control 44 can be stored in memory 22A as separate or combined modules. Additionally, the program control 44 may be implemented as separate dedicated processors or a single or-several processors to provide the function herein. While executing the computer program code, the processor 20 can read and/or write data to/from memory 22A, storage system 22B, and/or I/O interface 24. The bus 26 provides a communications link between each of the components in the computing device 14.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A leakage and breakdown testing structure for semiconductor structures, comprising:
   a plurality of voltage dividers comprising serially arranged resistor bridges, each of which is connected to a respective two terminal device,
   wherein the respective two terminal devices each further comprises a plurality of metal pairs of different patterns separated by dielectric material, and wherein one metal of each of the plurality of the metal pairs is connected to a pad of a power supply and another metal of each of the plurality of metal pairs is connected to a respective one of the resistor bridges;
   a plurality of switches each having a voltage node provided between resistors of a respective one of the voltage dividers, the voltage node being read at a common circuit pad when a respective one of the plurality of switches is in an on state; and
   a decoder configured to turn on and off each of the plurality of switches, individually.

2. The testing structure of claim 1, wherein the plurality of resistor bridges comprise two resistors, in series, and the switches are PFET switches.

3. The testing structure of claim 2, wherein a resistance ratio of the resistors is selected such that a maximum possible voltage at the voltage node is lower than a maximum allowed operating voltage of the plurality of switches.

4. The testing structure of claim 3, wherein a resistor type of the resistors is selected to handle a stress voltage Vdd.

5. The testing structure of claim 3, wherein the resistors have values that are configured to survive a failure mode of metal line pairs of the respective two terminal devices being completely shorted.

6. The testing structure of claim 5, further comprising a microcontroller that instructs the decoder to select a specific switch of the plurality of switches.

7. The testing structure of claim 6, wherein the microcontroller instructs the decoder to turn on each of the respective switches, so that all of the metal line pairs of the plurality of two terminal devices are measured one by one.

8. The testing structure of claim 6, wherein codes are used by the decoder to selectively and individually turn on each switch of the plurality of switches for measuring leakage of a respective two terminal device.

9. The testing structure of claim 6, further comprising an analog to digital converter which converts an analog voltage of a selected resistor to digital format.

10. The testing structure of claim 9, wherein the digital format is provided to the microcontroller and to a computing device.

11. The testing structure of claim 10, wherein the computing device performs post processing of leakage data.

12. The testing structure of claim 1, further comprising a voltage source providing a stress voltage to each of the respective two terminal devices.

13. The testing structure of claim 1, wherein the plurality of switches are controlled so as to provide element leakage vs. time behavior of each of the respective two terminal devices.

14. A leakage and breakdown testing circuit, comprising:
   a plurality of metal pairs of different patterns with a predefined separation distance, wherein one metal of each pair of metals is connected to a pad of the power supply, and wherein dielectric material under test is filled between the each metal pair;
   a plurality of resistor bridges, each bridge comprising two resistors in series, wherein another end of the other metal of each of the plurality of metal pairs is connected to a respective one of the resistor bridges;
   a plurality of PFET switches, wherein each PFET switch is coupled to a voltage node between the two resistors;
   a common circuit pad connected to each voltage node, for reading a voltage at the voltage node when each of the plurality of PFET switches is in an on state;
   a decoder configured to turn on and off each of the plurality of PFET switches, individually; and
   a microcontroller configured to provide instructions to the decoder, based on a digital signal received from an analog to digital converter.

15. The circuit of claim 14, further comprising a plurality of two terminal devices, wherein each of the plurality of two terminal devices is connected to one of the plurality of resistor bridges, and wherein each of the plurality of two terminal devices share a common voltage pad, and wherein the plurality of PFET switches are controlled such that element leakage vs. time behavior of the respective two terminal devices can be determined.

16. The circuit of claim 15, wherein the microcontroller instructs the decoder so that all metal line pairs of the plurality of two terminal devices are measured one by one, as each of the respective PFET switches are turned on.

17. The circuit of claim 15, wherein the common voltage pad provides a stress voltage to the two terminal devices.

* * * * *